United States Patent
Zhang

(10) Patent No.: US 8,448,791 B2
(45) Date of Patent: May 28, 2013

(54) SERVER ASSEMBLY

(75) Inventor: Hai-Long Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 298 days.

(21) Appl. No.: 12/860,680

(22) Filed: Aug. 20, 2010

(65) Prior Publication Data

US 2011/0180497 A1    Jul. 28, 2011

(30) Foreign Application Priority Data

Jan. 25, 2010    (CN) .................... 2010 2 0301407 U

(51) Int. Cl.
*A47F 7/00*    (2006.01)
(52) U.S. Cl.
USPC ............. 211/26; 211/26.2; 361/825; 248/201

(58) Field of Classification Search
USPC ........ 211/26, 26.2, 183, 189, 190; 312/223.1, 312/223.2, 265.4; 361/825, 829, 679.33, 361/679.37, 679.31; 108/108, 109; 248/201
See application file for complete search history.

(56) References Cited

U.S. PATENT DOCUMENTS

| 5,921,644 | A  | * | 7/1999  | Brunel et al. | ............ 312/223.2 |
| 6,202,570 | B1 | * | 3/2001  | Kurtsman      | .................. 108/108 |
| 6,269,959 | B1 | * | 8/2001  | Haworth       | ....................... 211/26 |
| 6,739,682 | B2 | * | 5/2004  | Shih          | ........................ 312/334.4 |
| 7,134,558 | B1 | * | 11/2006 | Mimlitch et al. | ............. 211/26 |

* cited by examiner

*Primary Examiner* — Korie H Chan
(74) *Attorney, Agent, or Firm* — Altis Law Group, Inc.

(57) ABSTRACT

A server assembly includes a server rack, and a bracket configured to mount a server to the server rack. The server rack includes a plurality of first supports located on the server rack. Two brackets are configured to secure the server between two of the plurality of first supports, and each bracket includes a first securing arm and a second securing arm connected to the first securing arm, wherein the first securing arm is secured to the server, and the second securing arm is secured to one of the plurality of first supports.

12 Claims, 4 Drawing Sheets

SERVER ASSEMBLY

BACKGROUND

1. Technical Field

The present disclosure relates to a server assembly for mounting a server to a server rack.

2. Description of Related Art

There are a large number of servers mounted in a typical server rack. The servers could be a power distribution module, a power switch, or a rack control module. The power distribution module is capable of offering a number of sockets. The power switch is capable of offering many switches. The rack control module is capable of controlling the system in the rack. What is needed is a way to mount the servers securely to the server rack.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
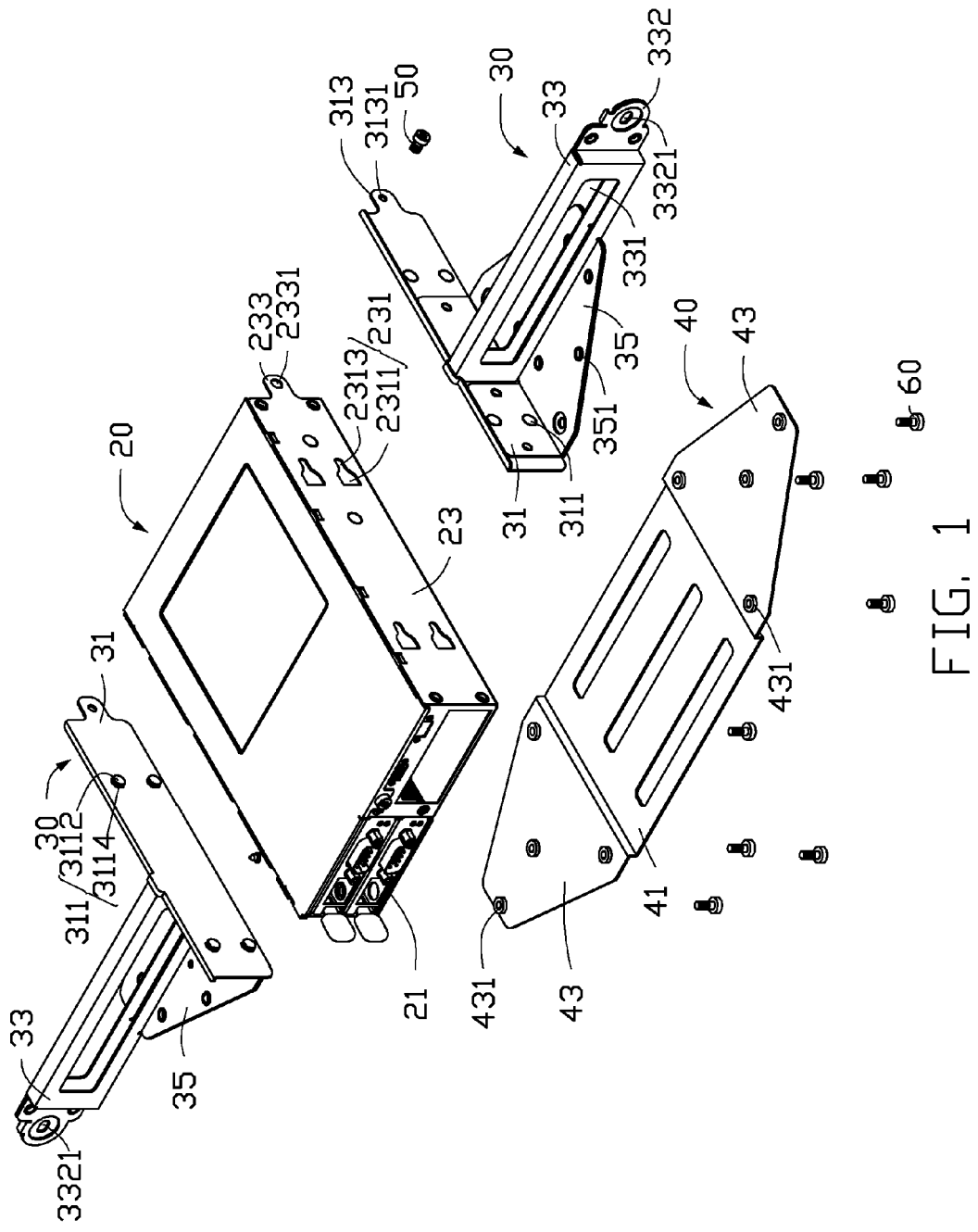
FIG. 1 is a partially, exploded view of a server assembly in accordance with an embodiment.
Figure 2:
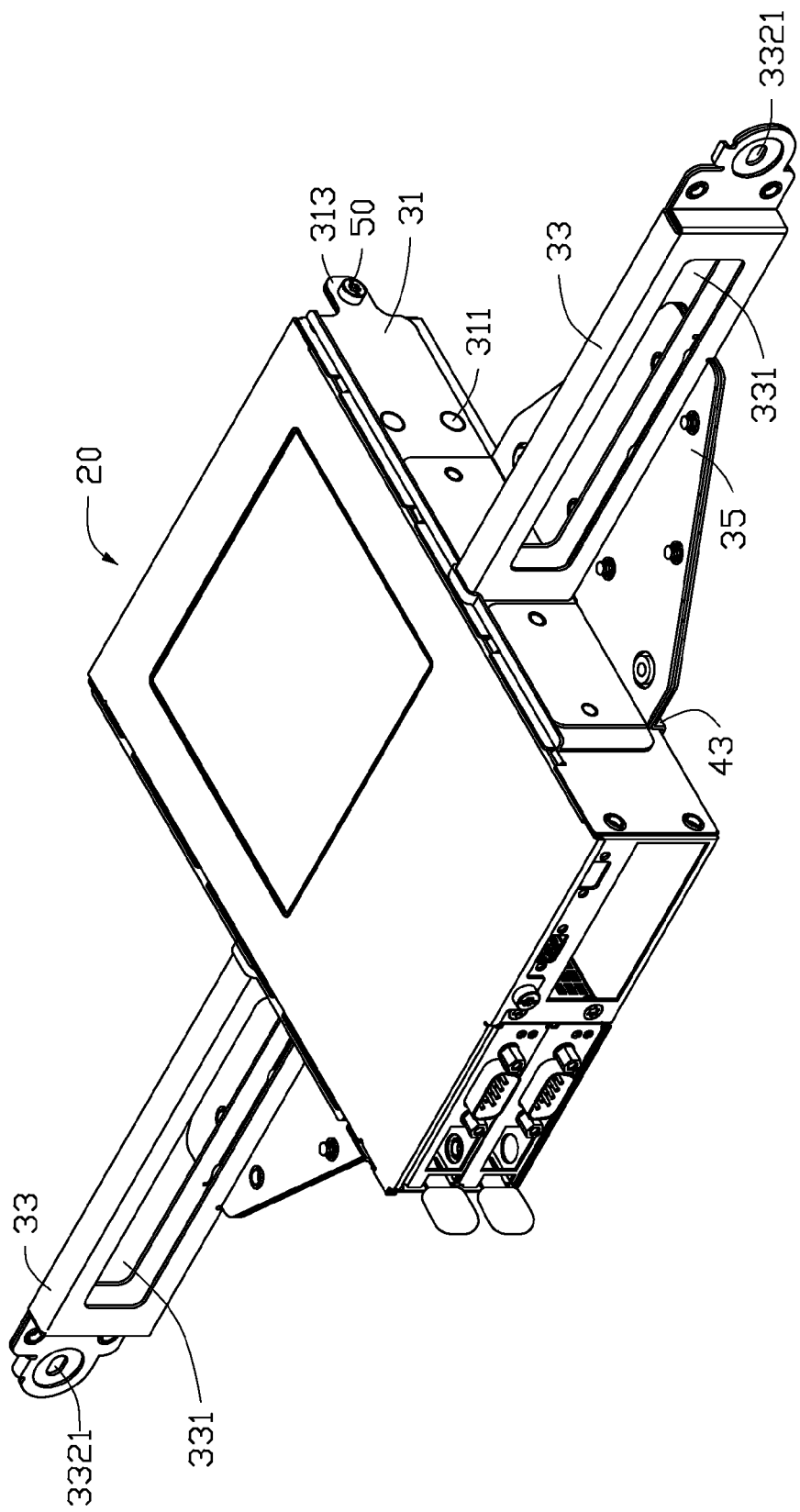
FIG. 2 is an assembled view of the server assembly of FIG. 1.

Referring to FIGS. 1 and 2, a server assembly, in accordance with one embodiment, includes a server rack 10 (shown in FIG. 3), a server 20 mounted on the server rack 10, two brackets 30 mounted on two opposite sides of the server 20, and a supporting member 40 mounted on a bottom surface of the server 20.

Figure 3:
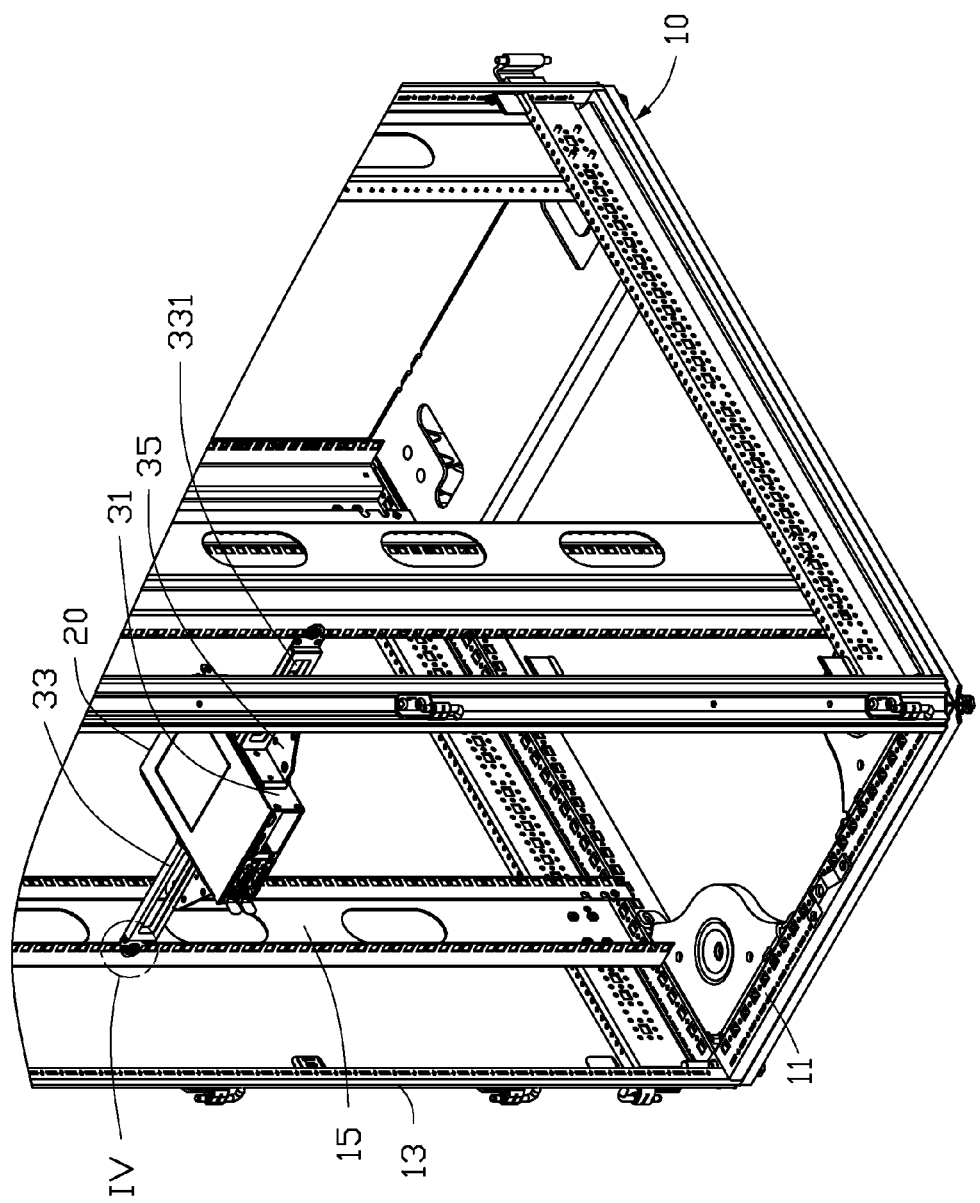
FIG. 3 is an assembled view of a server assembly.

Referring to FIG. 3, the server rack 10 includes a bottom base 11, four first supports 15 located in the server rack 10, and four second supports 13 located at four corners of the bottom base 11. In one embodiment, each second support 13 is upright, substantially parallel, and adjacent to each first support 15. A number of screw holes 151 are defined in the first support 15.

Referring to FIG. 1, the server 20 includes a bottom plate 21 and two side plates 23 substantially perpendicular to the bottom plate 21. Four positioning slots 231 are defined in each side plate 23. In one embodiment, each positioning slot 231 includes a guiding portion 2311 and a positioning portion 2313 communicating with the guiding portion 2311. The guiding portion 2311 is bigger than the positioning portion 2313. A screw portion 233 extends from an edge of each side plate 23. A mounting hole 2331 is defined in the screw portion 233. In one embodiment, the server 20 can be a power distribution module or a rack distribution module.

Each bracket 30 includes a first securing arm 31, a second securing arm 33 connected to the first securing arm 31, and two supporting arms 35. The supporting arms 35 are substantially perpendicular to the first securing arm 31 and the second securing arm 33. In one embodiment, the second securing arm 33 is substantially perpendicular to the first securing arm 31.

Four positioning posts 311 protrude from one side of each first securing arm 31, corresponding to the positioning slots 231 of the side plate 23. The positioning posts 311 are capable of engaging in the position slots 231 to secure the first securing arm 31 to the side plate 23 of the server 20. Each positioning post 311 includes a head 3112 and a neck 3114 having a diameter less than that of the head 3112. The size of the head 3112 is less than that of the guiding portion 2311, but lager than the size of the positioning portion 2313. The size of the neck 3114 is smaller than that of the positioning portion 2313. The head 3112 is capable of sliding into the positioning portion 2313, to position the neck 3114 in the positioning portion 2313.

A fixing portion 313 extends from an edge of the first securing arm 31. A fixing hole 3131 is defined in the fixing portion 313, corresponding to the mounting hole 2331 of the screw portion 233. A through hole 331 is defined in each second securing arm 33, and a mounting portion 332 extends from an edge of the second securing arm 33. The through hole 331 is configured to catch the bracket 30. A mounting hole 3321 is defined in the mounting portion 332, corresponding to one of the screw holes 151 in the first support 15. A number of securing holes 351 are defined in each supporting arm 35. In one embodiment, the two supporting arms 35 are located at the two opposite sides of the second securing arm 33.

Each supporting member 40 includes a main body 41 and two fastening arms 43 connected to opposite sides of the main body 41. The main body 41 is capable of supporting the bottom surface of the bottom plate 21 of the server 20. A plurality of fastening holes 431 is defined in each fastening arm 43, corresponding to the securing holes 351 of the supporting arms 35.

Referring to FIG. 2, in assembly, the head 3112 of each positioning post 311 is slid into the positioning portion 2313 from the guiding portion 2311, and the neck 3114 of each positioning post 311 is inserted in the positioning portion 2313. The fixing hole 3131 of the fixing portion 313 is aligned with the mounting hole 2331 of the screw portion 233. A fixing member 50, such as a screw, is screwed into the fixing hole 3131 and the mounting hole 2331, to mount the bracket 30 to the side plate 23.

The server 20 is placed on the supporting member 40, and the fastening holes 431 of fastening arm 43 are aligned with the securing holes 351 of the supporting arm 35. A plurality of fastening members 60, such as screws, are inserted into the fastening holes 431 and the securing holes 351, to mount the supporting member 40 to the bracket 30.

Figure 4:
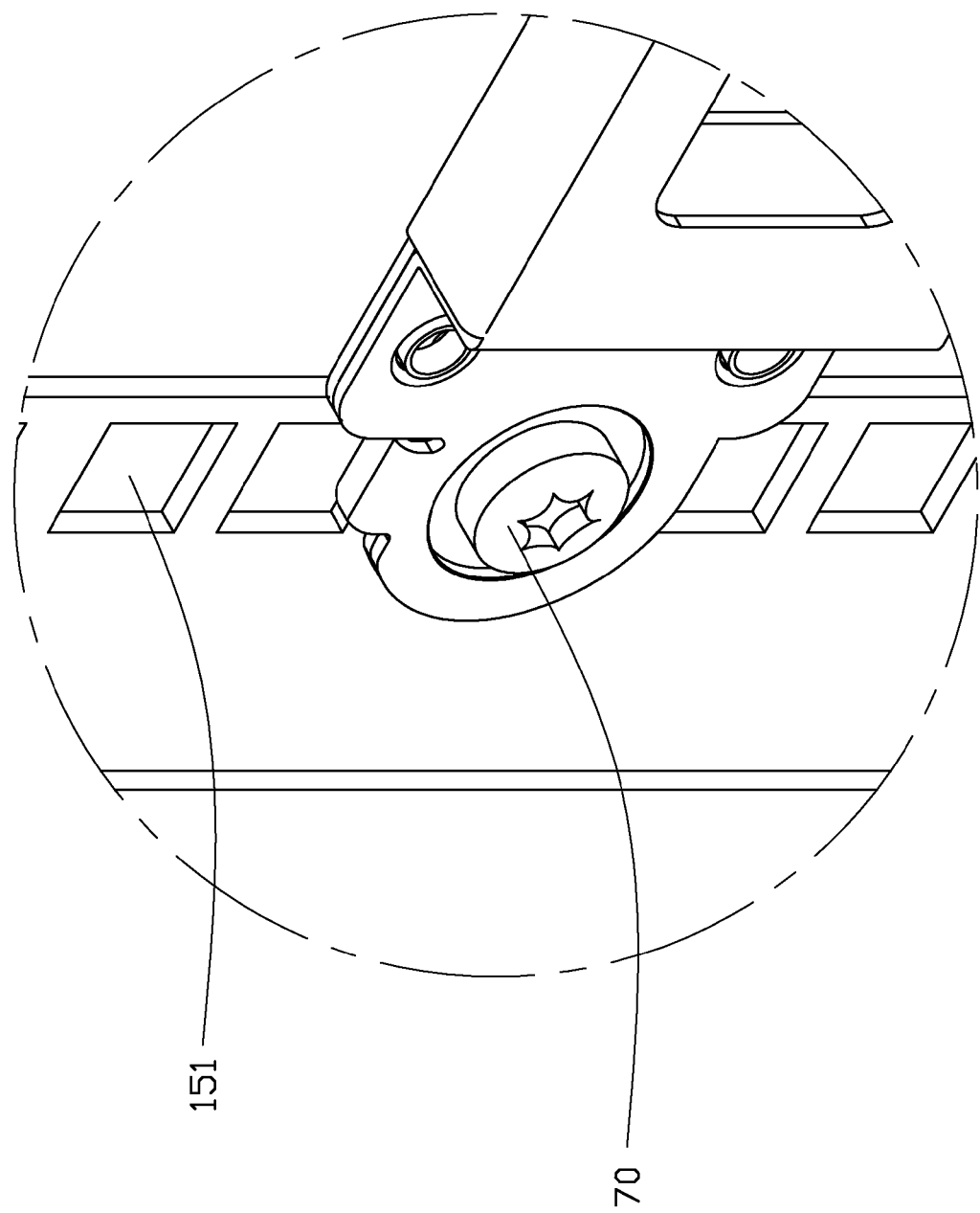
FIG. 4 is an enlarged view of circled portion IV of FIG. 3.

Referring to FIGS. 3 and 4, the server 20, the two brackets 30 and the supporting member 40 are placed between the first supports 15. The screw holes 151 of each first support 15 are aligned with the mounting holes 3321 of the mounting portion 332. Two screw members 70 are screwed into the screw holes 151 and the mounting holes 3321, to mount the two brackets 30 to the first supports 15.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A server assembly, comprising:
a server rack comprising a plurality of first supports located in the server rack;
two brackets securing a server between two of the plurality of first supports, each bracket of the two brackets comprising a first securing arm, a second securing arm connected to the first securing arm, and a supporting arm directly connected and substantially perpendicular to the first securing arm and the second securing arm; and
a supporting member comprising a main body and two fastening arms extending from opposite sides of the main body;
wherein the two fastening arms are substantially parallel to the main body; the main body is configured for being attached to a bottom plate of the server, the two fastening arms abut the supporting arm of each of the two brackets; the first securing arm is capable of being secured to the server, and the second securing arm is secured to one of the plurality of first supports.

2. The server assembly of claim 1, wherein the first securing arm is substantially perpendicular to the second securing arm.

3. The server assembly of claim 1, wherein the main body is located on a first plane, and the two fastening arms are located on a second plane that is higher than the first plane.

4. The server assembly of claim 1, wherein a positioning post protrudes on the first securing arm, and the positioning post is capable of engaging with a positioning slot defined in a side plate of the server.

5. The server assembly of claim 4, wherein the positioning post comprises a head and a neck connected to the head, and the diameter of the neck is less than that of the head.

6. The server assembly of claim 4, wherein a fixing portion extends from the first securing arm, and the fixing portion is capable of engaging with a screw portion of the side plate.

7. The server assembly of claim 1, wherein a mounting portion extends from the second securing arm, and the mounting portion is mounted to the one of the plurality of first supports.

8. A server assembly comprising:
a server rack comprising a plurality of first supports;
two brackets respectively capable of being mounted to two opposite side plates of a server, and a first one of the two brackets mounted to one of the plurality of first supports, a second one of the two brackets mounted to another of the plurality of first supports near to the one of the plurality of first supports; each of the two brackets comprising a supporting arm; and
a supporting member comprising a main body and two fastening arms extending from opposite side of the main body; the two fastening arms are substantially parallel to the main body;
wherein the main body is configured for being attached to a bottom plate of the server, the two fastening arms abuts the supporting arm of each of the two brackets;
wherein each of the two brackets comprises a first securing arm and a second securing arm connected to the first securing arm, and the first securing arm is mounted to a side plate of the server, and the second securing arm is mounted to one of the plurality of first supports;
the first securing arm is substantially perpendicular to the second securing arm;
a positioning post protrudes from the first securing arm, and the positioning post is capable of engaging with a positioning slot defined in each of two side plates of the server.

9. The server assembly of claim 8, wherein the supporting arm is directly connected and substantially perpendicular to the first securing arm and the second securing arm.

10. The server assembly of claim 8, wherein the positioning post comprises a head and a neck connected to the head, and the diameter of the neck is less than that of the head.

11. The server assembly of claim 10, wherein a fixing portion extends from the first securing arm, and the fixing portion is capable of mounting to a screw portion of the each of two side plates.

12. The server assembly of claim 8, wherein a mounting portion extends from the second securing arm, and the second securing arm is mounted to the first support.

* * * * *